United States Patent [19]

Courreges

[11] 4,392,150
[45] Jul. 5, 1983

[54] MOS INTEGRATED CIRCUIT HAVING REFRACTORY METAL OR METAL SILICIDE INTERCONNECT LAYER

[75] Inventor: Francis G. Courreges, Sandy, Utah

[73] Assignee: National Semiconductor Corporation, Santa Clara, Calif.

[21] Appl. No.: 200,648

[22] Filed: Oct. 27, 1980

[51] Int. Cl.$^3$ .................... H01L 27/02; H01L 23/48; H01L 29/46
[52] U.S. Cl. ....................................... 357/51; 357/59; 357/67; 357/71; 29/571; 427/88
[58] Field of Search ................... 357/67, 65, 68, 71, 357/59, 51; 29/571; 427/88

[56] References Cited

U.S. PATENT DOCUMENTS 3,381,182  4/1968  Thornton .............................. 357/68
3,537,174  11/1970  May ...................................... 357/67
4,291,322  9/1981  Clemens et al. ...................... 357/59

FOREIGN PATENT DOCUMENTS 1439209  6/1976  United Kingdom .............. 357/67 S

OTHER PUBLICATIONS

Crowder et al., 1 μm MOSFET VLSI Technology–Part VII . . . , IEEE J of SSC, vol. SC–14, No. 2, Apr. 1979, pp. 291–293.
S. P. Murarka, Refractory Silicides for Low Resistivity Gates and Interconnects, 1979 IEEE, pp. 454–457.

Primary Examiner—Andrew J. James
Attorney, Agent, or Firm—Neil B. Schulte; Paul J. Winters; Gail W. Woodward

[57] ABSTRACT

A partial silicide layer under a polycrystalline silicon (polysi) first level interconnect reduces the sheet resistance of the first level interconnect. The polysi insulates the silicide from possibly reactive materials and gases. Since the silicide is not deposited over contacts between the polysi and the substrate, conventional polysi/silicon ohmic contacts can be made.

2 Claims, 10 Drawing Figures

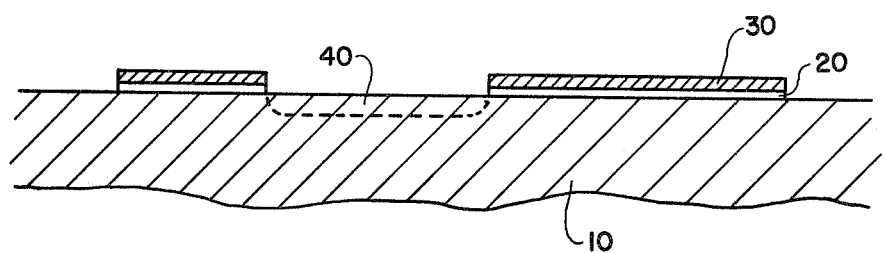
FIG. IA
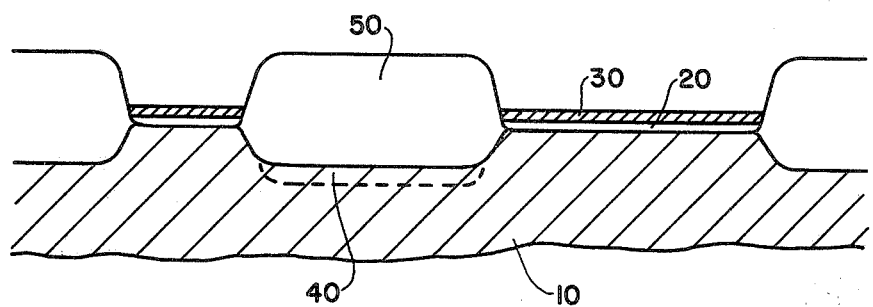
FIG. IB
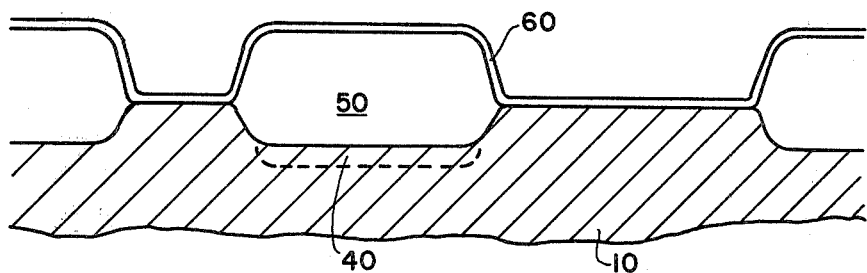
FIG. IC
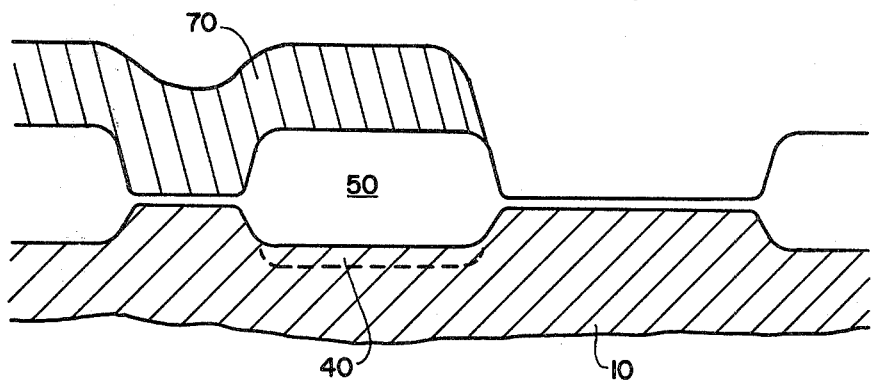
FIG. ID
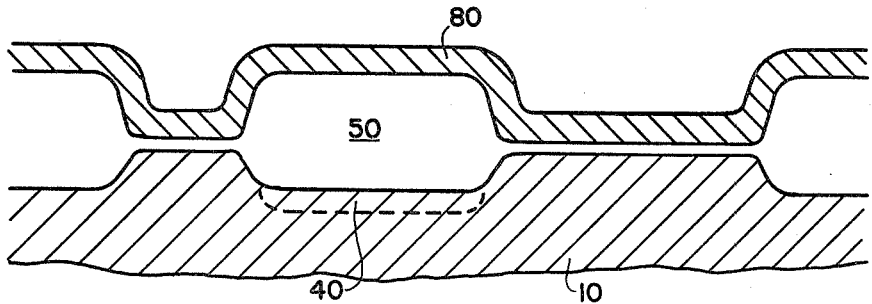
FIG. IE

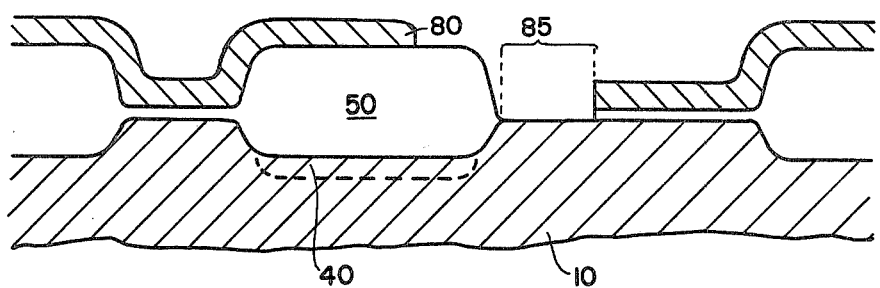
FIG. IF
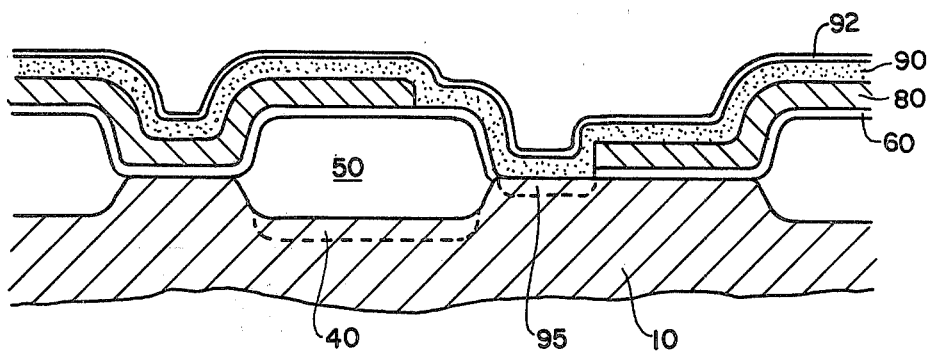
FIG. IG
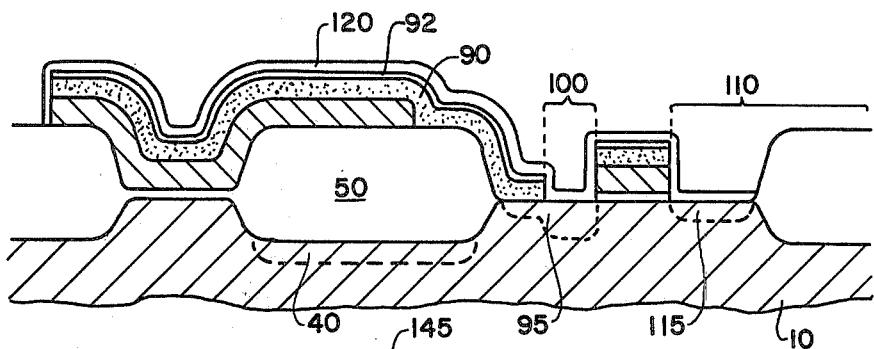
FIG. IH
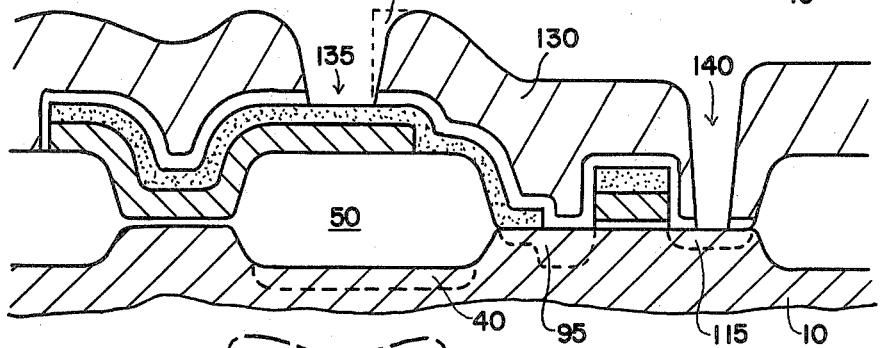
FIG. II
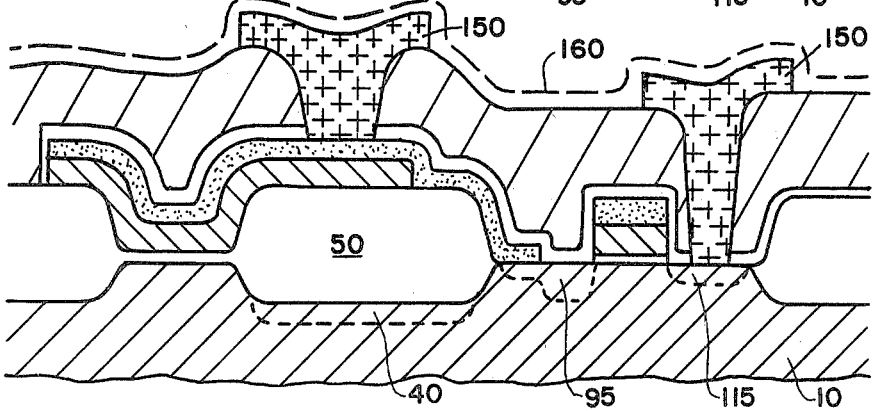
FIG. IJ

MOS INTEGRATED CIRCUIT HAVING REFRACTORY METAL OR METAL SILICIDE INTERCONNECT LAYER

BACKGROUND OF THE INVENTION

I. Field of the Invention

The present invention relates to the use of refractory metals or metal silicides as high conductivity metallization layers of MOSFETs. Specifically, the present invention is related to an integrated circuit having polycrystalline silicon deposited on high-conductivity metal silicide to form an interconnect layer for interconnecting selected gates and substrate areas of a MOSFET.

II. Description of the Prior Art

The increasing complexity of integrated circuit designs has required the development of multilayer interconnect processes. Typical two-layer interconnect processes have either two metal layers or one polycrystalline layer and one metal layer. The latter process is widely used in the manufacture of LSI MOS circuits. However, especially with regards to VLSI circuits, the relatively high resistivity of polycrystalline silicon (as compared to aluminum) substantially limits circuit performance. The use of refractory metals and refractory metal silicides for interconnect layers has been proposed to replace polycrystalline silicon in MOS and bipolar IC's in order to take advantage of the relatively low resistivity of these materials and their high stability at the high temperatures associated with many IC processing steps. A number of authors have recently reviewed the use of refractory metals or silicides as interconnect materials. For example, see T. Mochizuki et al., Japanese Journal of Applied Physics, 17, 37 (1978) and B. Crowder et al., IEEE Journal of Solid State Circuits, Vol. SC-14, No. 2, Apr. 1979, p291–293. "1 μm MOSFET VLSI Technology: . . . "

However, the use of silicides in VLSI Technology causes a number of problems. Specifically, it is difficult to provide a good ohmic contact between a silicide interconnect layer and a silicon substrate. Conventionally, the substrate is doped through the polycrystalline to establish a degree of continuity in doping between the polycrystalline layer and the substrate which improves the ohmic contact. However, silicides are diffusion barriers, which makes it impossible to form a good ohmic contact between a silicide interconnect layer and a substrate by the conventional method of doping the interconnect layer and driving the doping through to the contact area of the substrate. Secondly, silicide does not mechanically bond well to either polycrystalline silicon or to single crystal silicon. This is especially true when the silicide is deposited at a low temperature. Thirdly, silicides, especially when deposited by sputtering, do not always provide good step coverage over the vertical features of the integrated circuit. That is, sputtered silicides may be characterized by electrical discontinuities when they are deposited over vertical steps associated with integrated circuit surfaces. This is especially critical when the silicide is used by itself rather than in combination with a polycrystalline silicon. Finally, it is necessary to avoid any possible reaction between the silicide and the contacting layers or chemicals which will come in contact with the silicide during the manufacturing process.

SUMMARY OF THE INVENTION

The preferred embodiment on the present invention is a product and a process related to MOSFETs having a refractory metal or metal silicide interconnect layer. In accordance with the preferred embodiment of the present invention, refractory metal or metal silicide is deposited directly on a gate oxide/field oxide. A polycrystalline silicon layer is deposited directly on the silicide and overlaps the silicide to form contacts with the substrate at selected highly-doped contact regions.

BRIEF DESCRIPTION OF THE FIGURES

FIGS. 1A-1J are cross sectional illustrations of a MOSFET circuit during the sequential steps of a process according to the preferred embodiment of the present invention.

DETAILED DESCRIPTION OF THE PREFERRED EMBODIMENT

FIGS. 1A-J are cross sectional illustrations of a MOSFET circuit during the sequential steps of a process according to the preferred embodiment of the present invention. FIG. 1A illustrates a cross-section of a P-type silicon substrate 10. Using an initial oxidation mask, a 600A (Angstrom) thick pad oxide 20 is grown in selected regions on substrate 60 at a temperature of approximately 920° C. An 800A thick layer of silicon nitride 30 is deposited on pad oxide 20. The pad oxide and the silicon nitride cover the regions of substrate 10 which will become the active regions of the MOSFET circuit. A field implant of P-type ions are implanted in region 40 to reduce parasitic conduction in the regions intended to be inactive. In the next step, illustrated in FIG. 1B, the initial oxidation mask is removed and a field oxide 50 is grown to a thickness of approximately 9000A by wet oxidation at a temperature of approximately 1000° C. in the regions not protected by silicon nitride 30. Silicon nitride 30 and pad oxide 20 are then removed by etching.

A gate oxide 60, approximately 600A thick, is then uniformly grown on substrate 10 in a dry atmosphere of approximately 920° C. as shown in FIG. 1C. Since gate oxide 60 is quite thin and similar in composition to field oxide 50, in subsequent figures and discussion, the gate oxide and the field oxide are combined in the illustration and collectively referred to as oxide 50. At this point in the process it is convenient to make threshold adjustment implants. Specifically, ion implantation can be used to selectively construct enhancement or depletion type devices. These implants may involve the use of different resist mask, such as resist mask 70 illustrated in FIG. 1D.

FIG. 1E shows a uniform film of silicide 80 deposited by sputtering to a thickness of approximately 3000A over substrate 10. Specifically, MOSFET circuits have been produced using $TiSi_2$ (Titanium Silicide) and $MoSi_2$ (Molybdenum Silicide) by sputtering from solid targets. However, other metal silicides or refractory metals could be used. In alternate embodiments, the silicides of Zirconium, Hafnium, Vanadium, Niobium, Tantalum, Chronium, molybdenum or tungsten could be used instead of the silicide of Titanium. These silicides are known as refractory metal silicides because they are silicides of metals having high melting temperatures. These refractory metals and their silicides, referred to in the specification and claims as "refractory materials", are characterized by stability at high temperatures, and relatively low resistivities and the use of any of these refractory metals or their silicides could be used in alternative embodiments. Finally, other deposition methods, such as reactive sputtering, vacuum evaporation or chemical vapor deposition could be used.

In the preferred embodiment of the present invention, silicide 80 is applied by sputtering which may result in poor coverage of steep vertical steps associated with the topology of the MOSFET circuit to be formed. However, any gaps or discontinuities in the silicide layer do not affect the operation of the circuit. Any poor step coverage resulting from the sputtering of the silicide is overcome by the CVD polysilicon layer. This polysilicon layer will bridge any electrical discontinuities in the silicide layer while still allowing the silicide to lower the sheet resistance of the first interconnect level. If desired, at this point in the process, silicide 80 can be annealed by subjecting it to a heat treatment, laser annealing or an electron beam.

FIG. 1F illustrates the formation of a contact window 85 through silicide 80 and oxide 50 by an etching process using a buried contact mask. This mask is identical to the mask conventionally known as the polysi contact mask in the conventional polycrystalline interconnect process. In this etching step silicide 80 and oxide 50 are etched from areas where the first level interconnect will contact substrate 10. The silicide etch is performed with a Tegal Etcher, manufactured by the Tegal Company using $Cf_4/O_2$ plasma in a conventional plasma etching process. Oxide 50 in contact window 85 is etched by a buffered silicon dioxide etch.

FIG. 1G illustrates the nonselective uniform deposition of a polycrystalline silicon layer 90. Polycrystalline silicon layer 90 is deposited to a thickness of approximately 1200A by a low pressure chemical vapor deposition (CVD) process. At this step in process, silicon layer 90 is preferably doped with a dopant driven through silicon layer 90 and into substrate 10 to form the ohmic contact between the interconnect layer and the substrate. The polycrystalline silicon layer 90 is then oxidized to grow about 600A of silicon dioxide 92.

Subsequently, a gate mask is used to complete the definition of the silicide interconnect and gate geometry. As illustrated in FIG. 1H, windows 100 and 110 are formed by selective etching. Oxide layer 92 is selectively etched, the polycrystalline silicon layer 90 is etched in an LFE plasma etcheer using $C_2 ClF_5$, the silicide layer 80 is ectched by a conventional wet polycrystalline silicon etch. Alternatively, plasma etching of both layers could be accomplished, thereby eliminating the need to grow oxide layer 92 on the polycrystalline silicon.

The gate mask is now removed and source and drain regions 95 and 115 are doped with arsenic by ion implantation. Alternatively, phosphorus or other doping impurities could be used to dope the substrate using any of a number of doping processes, such as doped film deposition. This dopant is driven into silicon layer 90 and into substrate 10 by the use of a high temperature drive-in cycle done at temperature of approximately 950° C. This doping forms the ohmic contact between the doped silicon layer 90 and substrate 10. A reoxidation step then forms a 1200A thermal oxide 120 over the exposed substrate and polysilicon/silicide interconnect.

FIG. 1I illustrates a 1.15 μm thick vapox layer 130 formed by chemical vapor deposition of phosphorous doped silicon dioxide. Vapox layer 130 is phosphorous doped so that the subsequent high-temperature cycle causes the vapox to flow, rounding the edges of the vapox as shown, as for example, at corner 145. Contact holes 135 and 140 are etched through vapox layer 130 and thermal oxide 120 to make selected contacts with the polycrystalline silicon/silicide interconnect and with the substrate.

As shown in FIG. 1J, the integrated circuit is completed by depositing metal interconnects 150, masking the middle interconnect layer, and patterning the metal to form the desired connections. Finally, a thick scratch-protecting dialetric layer 160 is uniformly deposited over the entire integrated circuit for mechanical protection and contact pad windows are etched through this layer.

One of the features of the present invention is that in the final circuit the silicide layer is insulated from the vapox, the vapox etchant, and the atmosphere used in the vapox processing by a layer of polycrystalline silicon. Thus, any interaction between the silicide, the vapox, the vapox etchant, or the atmosphere used during the reflow process is avoided.

Another feature of the present invention is the use of silicide and polycrystalline silicon in the first interconnect level to lower the sheet resistivity of the first level interconnect type. Silicide has a resistivity of approximately 0.3–1.3 ohms per square as compared to the resistivity of polycrystalline silicon of 15–20. Thus, a low resistivity first level interconnect is achieved.

The present process also overcomes a number of the disadvantages previously attributed to the use of silicide as an interconnect level. Specifically, a good ohmic contact is provided between the silicide interconnect level and the substrate. Since the silicide does not overlap the substrate contact areas, a conventional polycrystalline silicon-to-substrate interconnect is formed by doping the polycrystalline silicon and driving the dopant through the polycrystalline silicon to the substrate areas to provide a good ohmic contact in a conventional manner.

Silicide bonds well to oxide but does not bond well to polycrystalline silicon or to crystalline silicon, especially when the silicide is deposited at a low temperature. The present process avoids this possible problem by eliminating the deposition of silicide on either polycrystalline silicon or upon the single-crystal silicon substrate. The silicide/polysilicon bond in the present invention involves the deposition of polycrystalline silicon or silicide at temperatures above 550° C. This relatively high temperature assures a relatively good bond between the two layers.

While the invention has been particularly taught and described with reference to the preferred embodiments, those versed in the art will appreciate that minor modifications in form and detail may be made without departing from the spirit and scope of the invention. Accordingly, all such modifications are embodied within the scope of this patent as properly come within my contribution to the art and are particularly pointed out by the following claims.

I claim:

1. A MOS integrated circuit structure with a low resistance silicide interconnect level comprising:
   a semiconductor substrate having a plurality of contact regions on the surface thereof;
   an insulating layer over the surface of said substrate with openings at said contact regions so as to expose said contact regions;

a silicide layer on said insulating layer formed into electrically conductive, low resistance, contact region connecting circuits, said silicide extending to, but not covering up, said contact regions; and a polycrystalline silicon layer on top of said silicide, formed into said connecting circuits, and extending beyond said silicide layer into said contact regions so as to provide good ohmic contact with said contact regions.

2. The structure of claim 1 in which said silicide is applied to said insulating layer by sputtering while said polycrystalline silicon is applied to said silicide at temperature above 550° C.

* * * * *